United States Patent
Wu

(10) Patent No.: US 6,713,393 B2
(45) Date of Patent: Mar. 30, 2004

(54) METHOD OF FORMING A NANOMETER-GATE MOSFET DEVICE

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 111 days.

(21) Appl. No.: 10/175,102

(22) Filed: Jun. 20, 2002

(65) Prior Publication Data

US 2003/0235990 A1 Dec. 25, 2003

(51) Int. Cl.[7] ............... H01L 21/302; H01L 21/3065; H01L 21/461
(52) U.S. Cl. ............... 438/689; 438/692; 438/700; 438/703; 438/706
(58) Field of Search ............... 438/689, 692, 438/700, 703, 706

(56) References Cited

U.S. PATENT DOCUMENTS

| | | |
|---|---|---|
| 5,614,430 A | 3/1997 | Liang et al. ............... 438/291 |
| 5,856,225 A | 1/1999 | Lee et al. ............... 438/291 |
| 5,955,759 A | 9/1999 | Ismail et al. |

*Primary Examiner*—Robert Kunemund
*Assistant Examiner*—Lynette T. Umez-Eronini
(74) *Attorney, Agent, or Firm*—Pro-Techtor International Services

(57) ABSTRACT

The nanometer-gate MOSFET device of the present invention comprises a shallow-trench-isolation structure; a pair of second conductive sidewall spacers being formed over each inner sidewall of a gate region and on a portion of a first conductive layer and a first raised field-oxide layers for forming an implant region in a central portion of a channel; a buffer-oxide layer being formed over each sidewall of the gate region for forming lightly-doped source/drain diffusion regions; a first sidewall dielectric spacer being formed over each sidewall of the buffer-oxide layers for forming heavily-doped source/drain diffusion regions; a second sidewall dielectric spacer being formed over each sidewall of the first sidewall dielectric spacers for forming a metal-silicide layer over each of heavily-doped source/drain diffusion regions; and a highly conductive-gate structure being formed in the gate region.

20 Claims, 6 Drawing Sheets

METHOD OF FORMING A NANOMETER-GATE MOSFET DEVICE

BACKGROUND OF THE INVENTION

1. Field of the Invention

The present invention relates generally to a scaled MOSFET device and its fabrication method and, more particularly, to a nanometer-gate MOSFET device and its fabrication method for ultra-large-scale integration (ULSI).

2. Description of Related Art

The metal-oxide-semiconductor (MOS) field-effect transistors including n-channel MOSFET and p-channel MOSFET in CMOS integrated-circuits are scaled very rapidly based on the known scaling rule in order to gain density·speed·power product. Basically, the surface dimensions of a device including device channel length and device channel width can be directly scaled by an advanced lithographic technique, and the device isolation and contact areas must also be scaled accordingly in order to increase the packing density of the integrated-circuits. However, as a gate length of a MOSFET device is further scaled down below 0.13 μm, there are several issues encountered: a larger tunneling current between the channel and the elongated conductive-gate layer near the trench corners in the channel-width direction; a larger tunneling current between the elongated conductive-gate layer and the source/drain diffusion regions; a higher source/drain junction capacitance due to the pocket or halo implant; a poorer subthreshold slope or off leakage current due to the improper profile formed under the gate region; and a contact integrity for shallow source/drain diffusion regions. These issues become serious as the gate length is scaled below 0.13 μm and the gate-oxide thickness is smaller than 25 Angstroms.

Several methods had been proposed to improve or alleviate a part of the issues as described above. For examples, U.S. Pat. No. 5,966,615 had described a process for forming a shallow-trench-isolation (STI) structure to eliminate a larger tunneling current between the channel and the elongated conductive-gate layer near the trench corners in the channel-width direction, however the active region of a device is reduced by the formed oxide spacer; U.S. Pat. No. 5,614,430 had proposed a process for forming a MOSFET device with an anti-punchthrough ion-implantation through an opened gate region to reduce the parasitic source/drain junction capacitances due to a pocket or halo implant, however the other issues as stated are overlooked and the process steps for forming a MOSFET device are critical for practical applications; U.S. Pat. No. 5,856,225 had described a process of forming a MOSFET device with a self-aligned, ion-implanted channel region after source and drain formation, however a shallow-trench-isolation (STI) used is difficult to eliminate the larger leakage current between the channel and the elongated conductive-gate layer near the trench corners in the channel-width direction and between the source/drain diffusion region and the elongated conductive-gate layer through the overlapping area, moreover the metal-silicide layer over each of the source/drain diffusion regions are experienced by several thermal cycles such as the gate-oxide formation, the poly-gate formation, and the poly-gate silicidation and the integrity of source/drain contacts becomes a major issue; U.S. Pat. No. 5,955,759 had described the elevated conductive layers over the source/drain diffusion regions by using a selective epitaxy technique to reduce the contact resistance for shallow source/drain junctions, however the high parasitic capacitances between a T-shaped gate and the elevated source/drain conductive layers become a drawback for a high-performance MOSFET device.

It is, therefore, an objective of the present invention to offer a MOSFET device and its manufacturing method for eliminating and alleviating the issues encountered.

SUMMARY OF THE INVENTION

Accordingly, the present invention discloses a basic MOSFET device structure and its manufacturing method for forming a nanometer-gate MOSFET device. The nanometer-gate MOSFET device of the present invention comprises a shallow-trench-isolation structure for eliminating the tunneling current between the channel and the elongated conductive-gate layer near the trench corners in the channel-width direction; a self-aligned source/drain diffusion structure with a buffer region to reduce the overlapping area between the elongated conductive-gate layer and the lightly-doped source/drain diffusion regions and with a offset region for forming a self-aligned silicidation source/drain contact; and a highly conductive-gate structure for forming an implant region in a central portion of the channel to eliminate the parasitic source/drain junction capacitances and the punch-through effect.

The shallow-trench-isolation structure of the present invention comprises a first conductive layer over a gate-dielectric layer being formed over the channel region and the first raised field-oxide layer being formed in the shallow-trench-isolation region under the elongated conductive-gate layer. The self-aligned source/drain diffusion structure comprises a buffer-oxide layer being formed over each sidewall of the gate region and on each side portion of the gate region for forming the lightly-doped source/drain diffusion regions; a first sidewall dielectric spacer being formed over each sidewall of the buffer-oxide layers for forming the heavily-doped source/drain diffusion regions; and a second sidewall dielectric spacer being formed over each sidewall of the first sidewall dielectric spacers to define the self-aligned source/drain silicidation contacts. The highly conductive-gate structure comprises a pair of second conductive sidewall spacers being formed over each inner sidewall of the elongated-gate region and on a portion of a flat surface formed by the first conductive layer and the first raised field-oxide layers for forming an implant region in a self-aligned manner and a composite conductive gate structure including a salicide-gate, a polycide-gate, or a metal-gate being formed over the flat surface formed by the first conductive layer and the first raised field-oxide layers.

DETAILED DESCRIPTION OF THE PREFERRED EMBODIMENTS

Figure 1A:
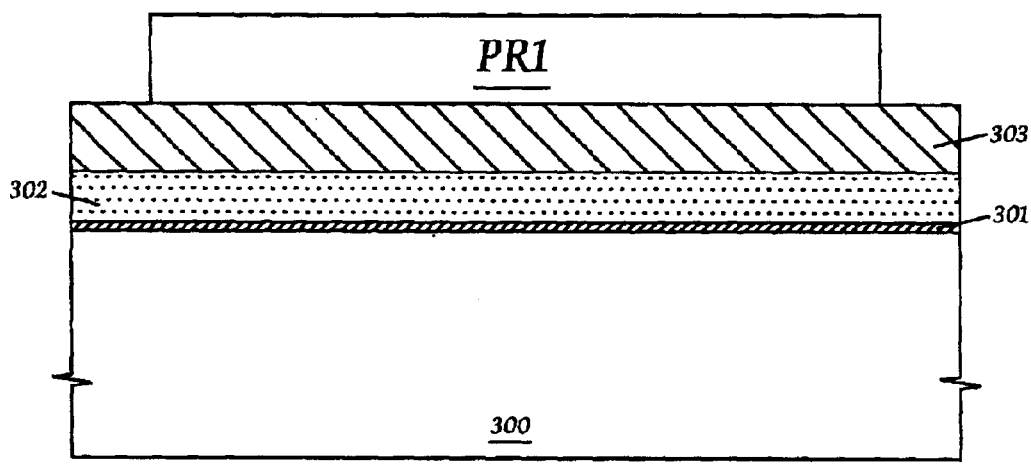
FIG. 1A through FIG. 1C show the process steps and their cross-sectional views for forming a shallow-trench-isolation structure of the present invention.
Figure 1B:
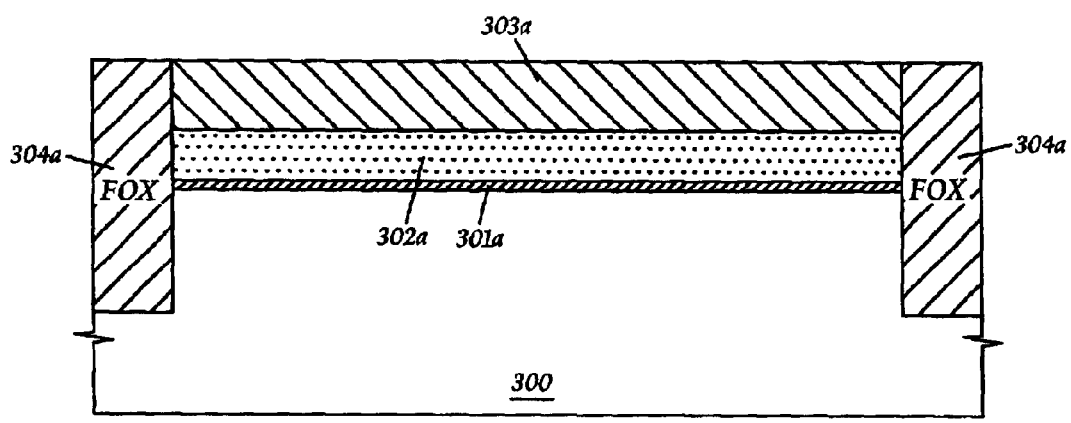
Figure 1C:
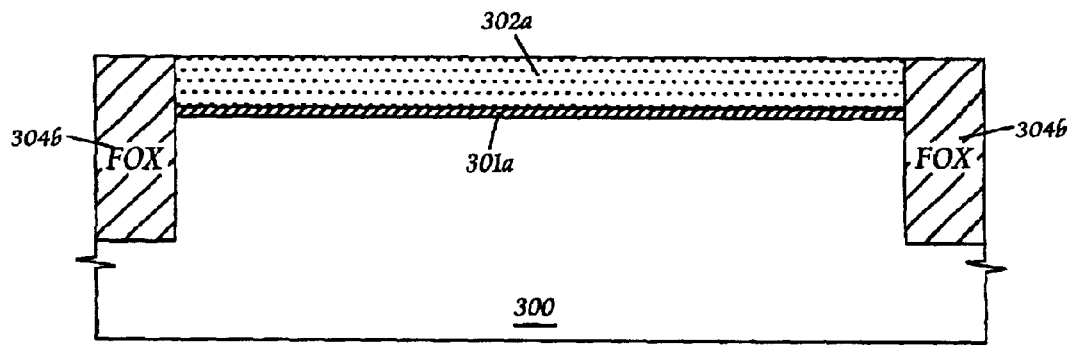

Referring now to FIG. 1A through FIG. 1C, there are shown the process steps and their cross-sectional views for forming a shallow-trench-isolation (STI) structure. FIG. 1A shows that a gate-dielectric layer 301 is formed over a semiconductor substrate 300 of a first conductivity type; a first conductive layer 302 is formed over the gate-dielectric layer 301; a first masking dielectric layer 303 is formed over the first conductive layer 302; and a masking photoresist PR1 is formed over the first masking dielectric layer 303 to define an active region (under PR1) and an isolation region (outside of PR1). The gate-dielectric layer 301 is preferably a thermal-oxide layer or a nitrided thermal-oxide layer and its thickness is preferably between 15 Angstroms and 300 Angstroms. The first conductive layer 302 is preferably a doped polycrystalline-silicon layer or a doped amorphous-silicon layer as deposited by low-pressure chemical-vapor-deposition (LPCVD) and its thickness is preferably between 100 Angstroms and 1500 Angstroms. The first masking dielectric layer 303 is preferably a silicon-nitride layer as deposited by LPCVD and its thickness is preferably between 200 Angstroms and 2000 Angstroms.

FIG. 1B shows that the first masking dielectric layer 303, the first conductive layer 302, and the gate-dielectric layer 301 outside of the masking photoresist PR1 are sequentially removed by using reactive ion etching (RIE) and then the semiconductor substrate 300 is anisotropically etched by using RIE to form a shallow trench; and subsequently, the masking photoresist PR1 is stripped and a planarized field-oxide layer 304a is formed to fill up the formed shallow trench. The shallow trench in the semiconductor substrate 300 is preferably between 3000 Angstroms and 10000 Angstroms. The planarized field-oxide layer 304a is preferably made of silicon-dioxides or P-glass as deposited by high-density plasma CVD (HDPCVD) or plasma-enhanced (PE) CVD and is formed by first depositing a thick-oxide film 304 to fill up a gap formed by the shallow trench and then planarizing the deposited thick-oxide film 304 using chemical-mechanical polishing (CMP) with the first masking dielectric layer 303a as a polishing stop. It should be noted that a thermal oxidation process can be used to eliminate the defects produced over the trenched semiconductor surface.

FIG. 1C shows that the planarized field-oxide layer 304a is etched back by anisotropic dry etching to a depth equal to a thickness of the first masking dielectric layer 303a to form a first raised field-oxide layer 304b and the first masking dielectric layer 303a is then removed by hot-phosphoric acid or anisotropic dry etching. It is clearly seen that a flat surface is formed by the first conductive layer 302a and the first raised field-oxide layer 304b for fine-line lithography later on.

It should be emphasized that the flat surface shown in FIG. 1C can be formed without the first masking dielectric layer 303a or the first masking dielectric layer 303a being made of silicon-oxides or silicon-oxynitrides, as deposited by LPCVD.

Figure 2A:
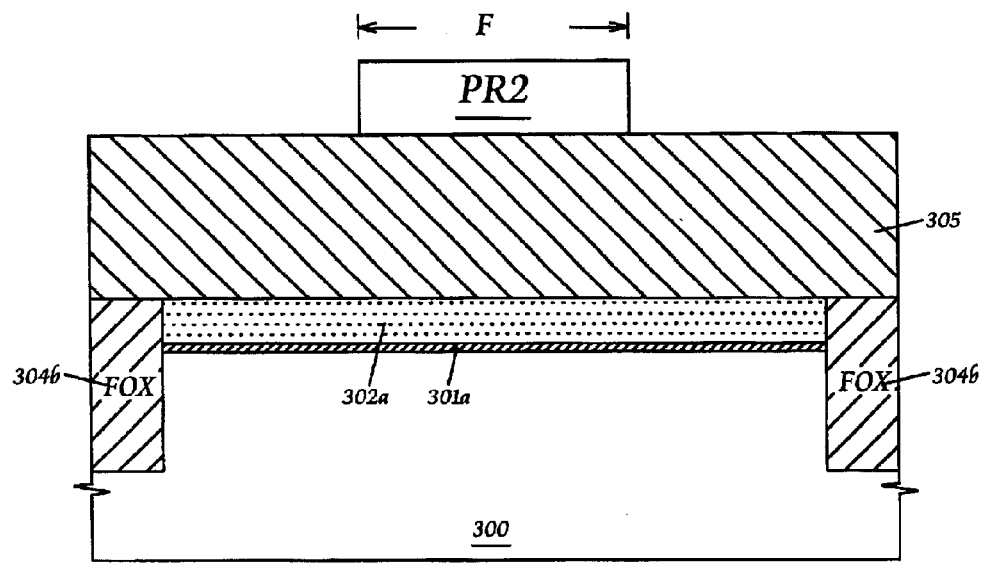
FIG. 2A through FIG. 2H show the process steps and their cross-sectional views for forming a nanometer-gate MOSFET device having a salicide-gate structure and a polycide-gate structure of the present invention.

Referring now to FIG. 2A through FIG. 2H, there are shown the process steps and their cross-sectional views of fabricating a nanometer-gate MOSFET device for a first embodiment of the present invention on the shallow-trench-isolation (STI) structure shown in FIG. 1C. FIG. 2A shows that a second masking dielectric layer 305 is formed over the STI structure shown in FIG. 1C and a masking photoresist PR2 is formed over the second masking dielectric layer 305 to define a gate region across the active region and the isolation region. The gate width can be a minimum-feature-size (F) as marked in FIG. 2A. The second masking dielectric layer 305 is preferably made of silicon-nitrides as deposited by LPCVD and its thickness is preferably between 2000 Angstroms and 8000 Angstroms.

Figure 2B:
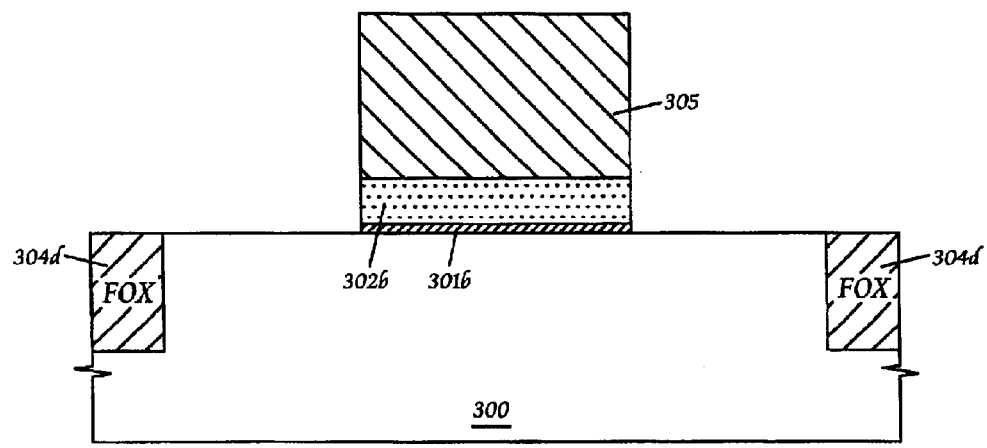

FIG. 2B shows that the second masking dielectric layer 305 outside of the masking photoresist PR2 is anisotropically removed first by using RIE, then the first raised field-oxide layers 304b are etched back to a depth equal to a thickness of the first conductive layer 302a to form second raised field-oxide layers 304c; and subsequently, the first conductive layers 302a are anisotropically removed by RIE and then the gate-dielectric layers 301a are removed by dipping in a dilute hydrofluoric acid or using anisotropic dry etching and the second raised field-oxide layers 304c are simultaneously etched to form the third raised field-oxide layers 304d, and then the masking photoresist PR2 is stripped.

Figure 2C:
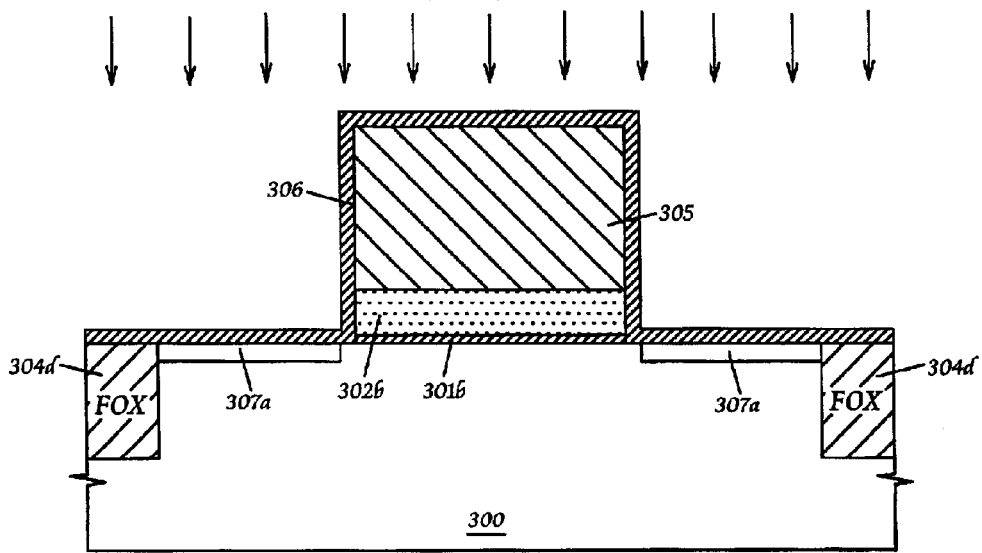

FIG. 2C shows that a buffer-oxide layer 306 is formed over the whole structure shown in FIG. 2B including the top and sidewalls of the gate region, the exposed semiconductor-substrate surfaces, and the third raised field-oxide layers 304d; and an ion implantation is performed in a self-aligned manner by implanting doping impurities across the buffer-oxide layers 306 into the semiconductor substrate 300 to form lightly-doped source/drain implant regions 307a of a second conductivity type. It is clearly seen that the buffer-oxide layer 306 not only creates an extension region for lateral diffusion of the lightly-doped source/drain implant regions 307a to eliminate the excessive extension of the lightly-doped source/drain diffusion regions 307b under the gate region after thermal activation process, but also forms a barrier-oxide layer for forming shallow lightly-doped source/drain implant regions 307a. The buffer-oxide layer 306 is preferably a silicon-dioxide layer as deposited by high-temperature oxide (HTO) deposition or LPCVD and its thickness is preferably between 100 Angstroms and 1000 Angstroms.

Figure 2D:
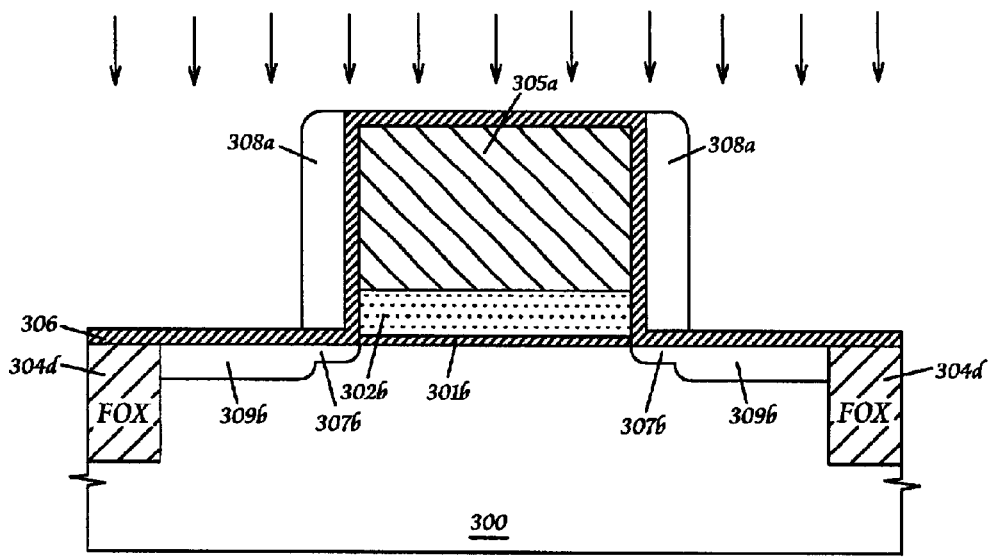

FIG. 2D shows that a first sidewall dielectric spacer 308a is formed over each sidewall of the buffer-oxide layers 306 and an ion-implantation is performed in a self-aligned manner by implanting doping impurities across the buffer-oxide layers 306 to form heavily-doped source/drain implant regions 309a of the second conductivity type in the semiconductor substrate 300; and a thermal annealing process is performed to activate the implanted doping impurities. The first sidewall dielectric spacer 308a is preferably made of silicon-oxides as deposited by LPCVD and is formed by first depositing a silicon-dioxide layer 308 and then etching back a thickness of the deposited silicon-dioxide layer 308.

Figure 2E:
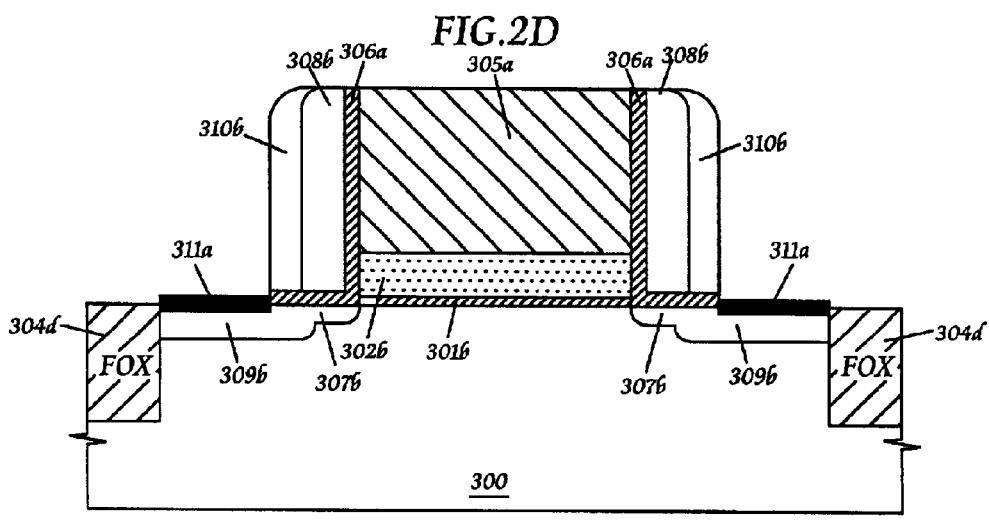

FIG. 2E shows that a second sidewall dielectric spacer 310a is formed over each sidewall of the first sidewall dielectric spacers 308a and on the buffer-oxide layer 306; an etching-back process is performed to remove the buffer-oxide layer 306 over the second masking dielectric layer 305a and over the semiconductor surfaces and the third raised field-oxide layers 304d outside of the second sidewall dielectric spacers 310a, and to simultaneously etch the first and second sidewall dielectric spacers 308a, 310a. FIG. 2E also shows that a well-known self-aligned silicidation process is performed to form a metal-silicide layer 311a over each of the heavily-doped source/drain diffusion regions 309b outside of the second sidewall dielectric spacers 310b. The second sidewall dielectric spacer 310b is preferably made of silicon-dioxides as deposited by LPCVD and is formed by first depositing a silicon-dioxide layer 310 and then etching back a thickness of the deposited silicon-dioxide layer 310 plus the buffer-oxide layer 306. It is clearly seen that the second sidewall dielectric spacer 310b creates an offset region for forming the metal-silicide layer 311a over each of the flat junction depth portion of the heavily-doped source/drain diffusion regions 309b to improve the contact integrity of the source/drain silicidation contacts. The metal-silicide layer 311a is preferably made of a refractory-metal silicide layer such as a titanium-disilicide ($TiSi_2$) or cobalt-disilicide ($CoSi_2$) layer. It should be emphasized that an ion-implantation can be performed after the formation of the second sidewall dielectric spacers 310b to form deeper heavily-doped source/drain implant regions (not shown) in a self-aligned manner to further improve the contact resistance and the contact integrity, and the thermal annealing process as described in FIG. 2D is performed after the formation of the deeper heavily-doped source/drain implant regions.

Figure 2F:
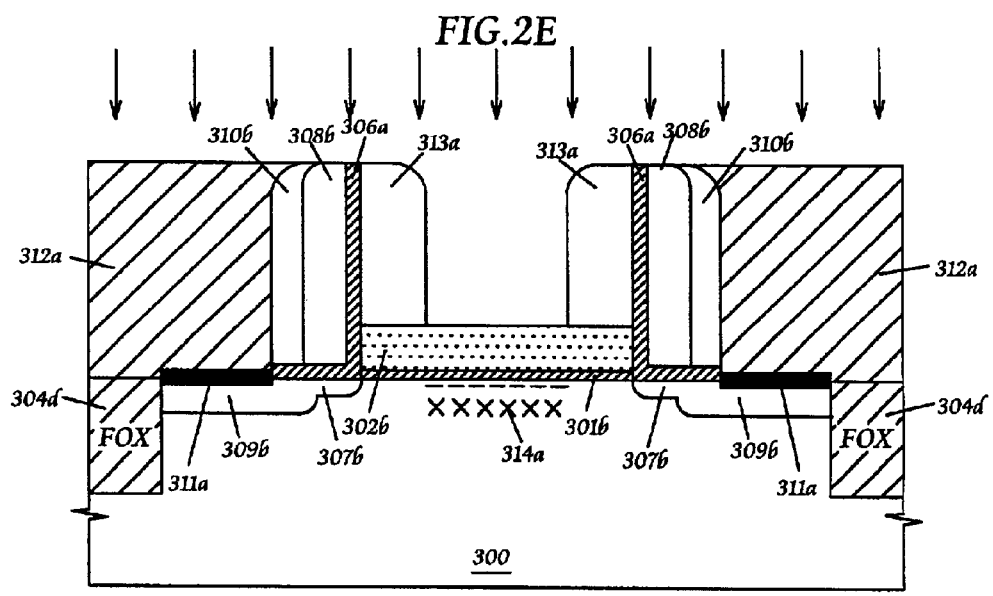

FIG. 2F shows that a planarized thick-oxide layer 312a is formed over each side portion of the gate region and then the second masking dielectric layer 305a is removed by using hot-phosphoric acid or anisotropic dry etching and subsequently a pair of second conductive sidewall spacers 313a are formed over each inner sidewall of the buffer-oxide layers 306a and on a portion of the first conductive layer 302b and the first raised field-oxide layers 304b; and subsequently, ion-implantations are performed by implanting doping impurities across the first conductive layer 302b and the gate-dielectric layer 301b between the pair of second conductive sidewall spacers 313a into the semiconductor substrate 300 to form an implant region 314a in a self-aligned manner, wherein the implant region 314a includes a shallow implant region as indicated by the dash lines for threshold-voltage adjustment and a deep implant region as indicated by the cross symbols for forming a punch-through stop. The second conductive sidewall spacer 313a is preferably made of doped polycrystalline-silicon or metal-disilicides such as tungsten-disilicides ($WSi_2$) as deposited by LPCVD and its sidewall-spacer width is preferably between 100 Angstroms and 1000 Angstroms. The second conductive sidewall spacer 313a is formed by first depositing a second conductive layer 313 over the whole structure and then etching back a thickness of the deposited second conductive layer 313. It should be noted that for an n-channel MOSFET device, the shallow implant region and the deep implant region are of the first conductivity type; for a p-channel MOSFET device, the deep implant region is of the first conductivity type and the shallow implant region can be of the second conductivity type for forming a buried-channel p-MOSFET device.

Figure 2G:
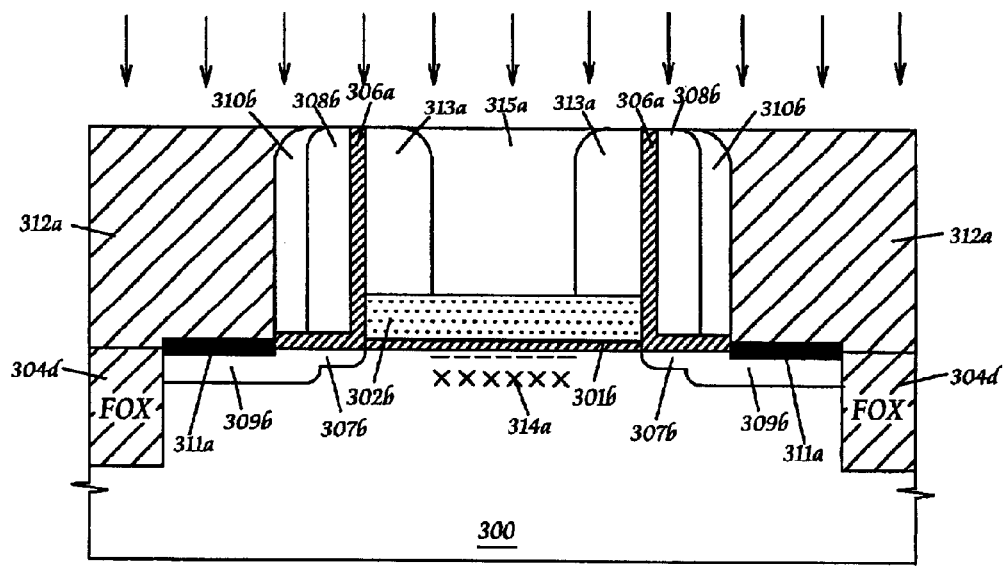

FIG. 2G shows that a planarized third conductive layer 315a is formed over the first conductive layer 302b and the first raised field-oxide layers 304b between the pair of second conductive sidewall spacers 313a. The planarized third conductive layer 315a is preferably made of doped polycrystalline-silicon or tungsten-disilicides ($WSi_2$) as deposited by LPCVD or sputtering. The planarized third conductive layer 315a is formed by first depositing a thick third conductive film 315 to fill up a gap between the pair of second conductive sidewall spacers 313a and then planarizing the deposited thick third conductive layer 315 using CMP or etching back. It is clearly seen that there are four combinations for forming a conductive-gate structure: the pair of second conductive sidewall spacers 313a are made of doped polycrystalline-silicon or tungsten-disilicides; the pair of second conductive sidewall spacers 313a are made of tungsten-disilicides and the planarized third conductive layer 315a is made of doped polycrystalline-silicon or tungsten-disilicides. It should be noted that the pair of second conductive sidewall spacers 313a and the planarized third conductive layer 315a can be further heavily implanted if they are made of doped polycrystalline-silicon.

Figure 2H:
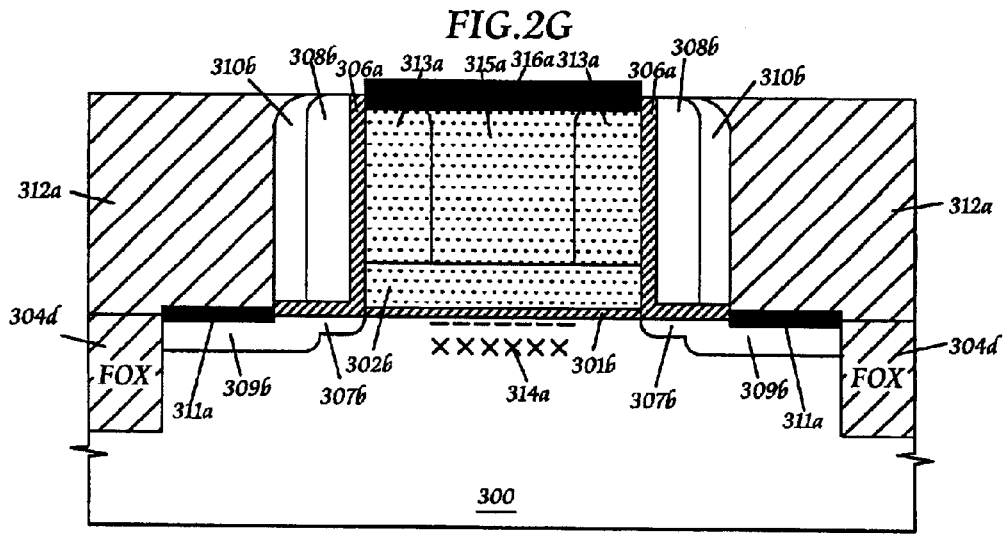
Figure 2H:
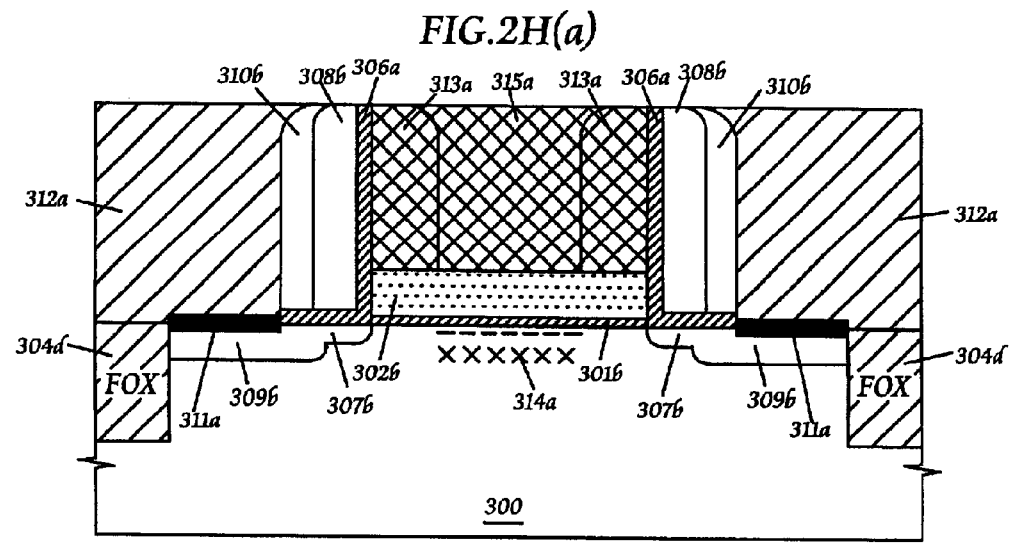

FIG. 2H(a) shows that the pair of second conductive sidewall spacers 313a and the planarized third conductive layer 315a being made of polycrystalline-silicon is silicided with a metal-silicide layer 316a by using a well-known self-aligned silicidation process for forming a salicide-gate structure. The metal-silicide layer 316a is preferably made of refractory-metal silicides such as titanium-disilicide ($TiSi_2$) or cobalt-disilicide ($CoSi_2$).

FIG. 2H(b) shows that the pair of second conductive sidewall spacers 313a and the planarized third conductive layer 315a are made of metal-disilicides such as tungsten-disilicides ($WSi_2$) for forming a polycide-gate structure.

Figure 3A:
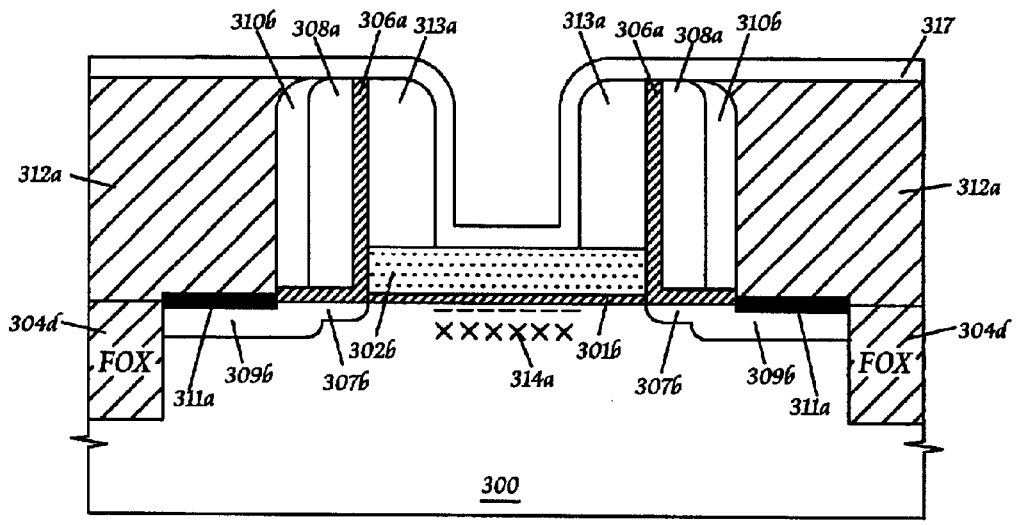
FIG. 3A through FIG. 3C show the process steps after FIG. 2F and their cross-sectional views for forming a nanometer-gate MOSFET device having a first composite-gate structure of the present invention.
Figure 3B:
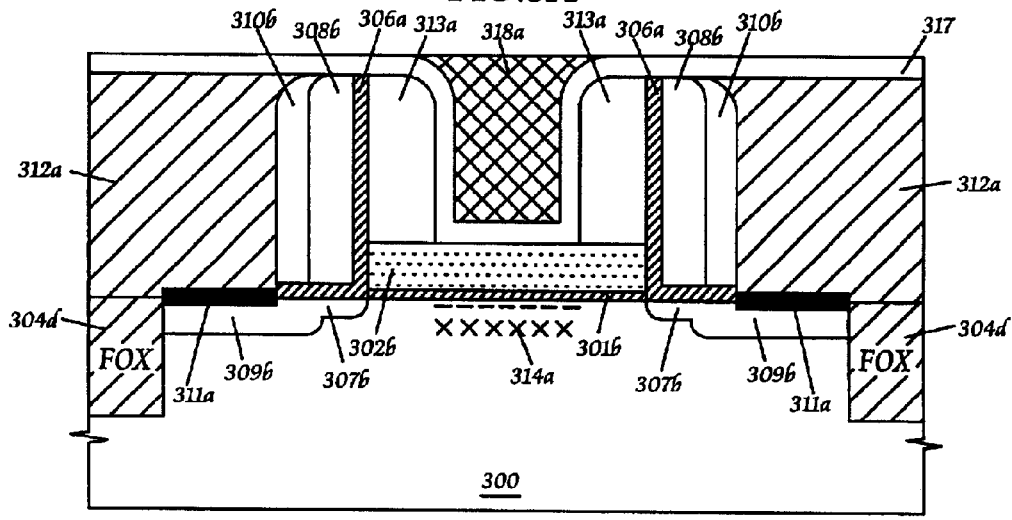
Figure 3C:
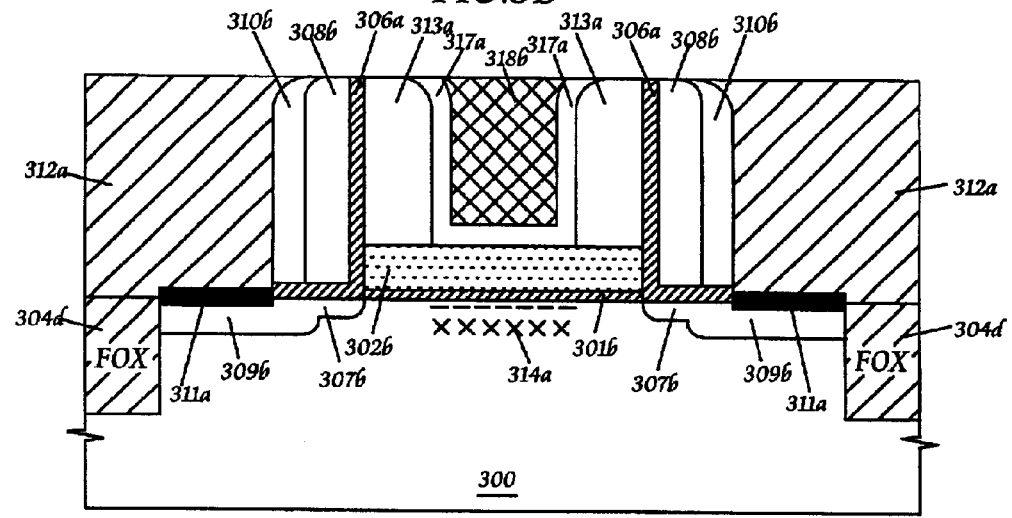

Referring now to FIG. 3A through FIG. 3C, there are shown the process steps after FIG. 2F and their cross-sectional views of fabricating a nanometer-gate MOSFET device having a first composite-gate structure. FIG. 3A shows that a barrier-metal layer 317 is formed over the whole structure shown in FIG. 2F including at least the pair of second conductive sidewall spacers 313a, the first conductive layer 302b and the first raised filed-oxide layer 304b between the pair of second conductive sidewall spacers 313a, wherein the pair of second conductive sidewall spacers 313a are made of doped polycrystalline-silicon or metal-disilicides such as tungsten-disilicides. The barrier-metal layer 317 is preferably made of titanium-nitrides (TiN) or tantalum-nitrides (TaN) as deposited by sputtering or LPCVD.

FIG. 3B shows that a planarized metal layer 318a is formed over the barrier-metal layer 317. The planarized metal layer 318a is preferably made of tungsten, aluminum, or copper and is formed by first depositing a thick metal film 318 to fill up a gap and then planarizing the deposited metal film 318 using CMP with the barrier-metal layer 317 as a polishing stop.

Figure 4A:
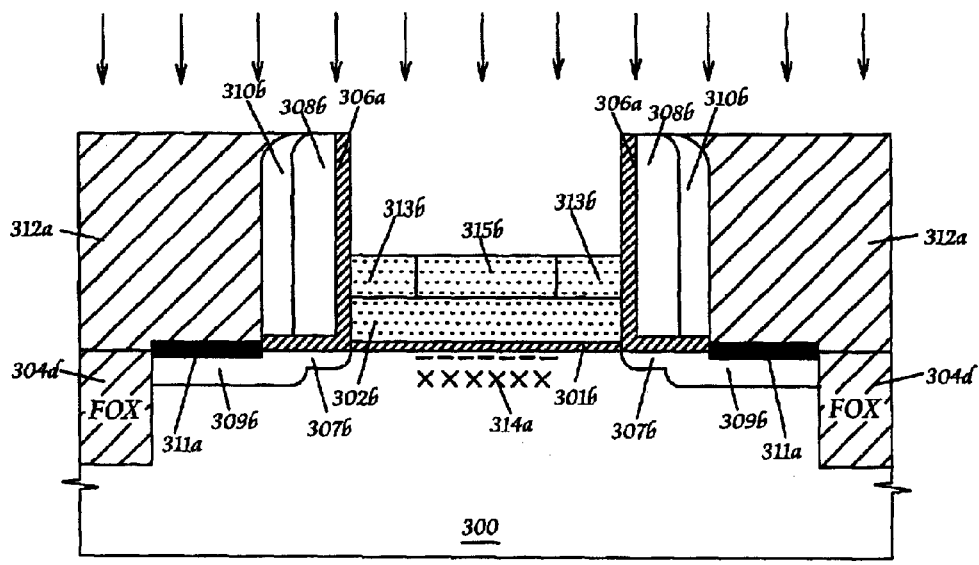
FIG. 4A through FIG. 4C show the process steps after FIG. 2G and their cross-sectional views for forming a nanometer-gate MOSFET device having a second composite-gate structure of the present invention.

FIG. 3C shows that the barrier-metal layers 317 outside of the planarized metal layer 318a are further removed by using CMP or are etched by using either anisotropic dry etching or wet etching using a $NH_4OH:H_2O_2:H_2O$ (1:1:5) solution. It is clearly seen that a highly conductive gate structure is obtained by the present invention Referring now to FIG. 4A through FIG. 4C, there as shown the process steps after FIG. 2G and their cross-sectional views of forming a nanometer-gate MOSFET device having a second composite-gate structure. FIG. 4A shows that the pair of second conductive sidewall spacers 313a and the planarized third conductive layer 315a are etched back anisotropically using RIE to a depth approximately equal to 1000 Angstroms and 3000 Angstroms.

Figure 4B:
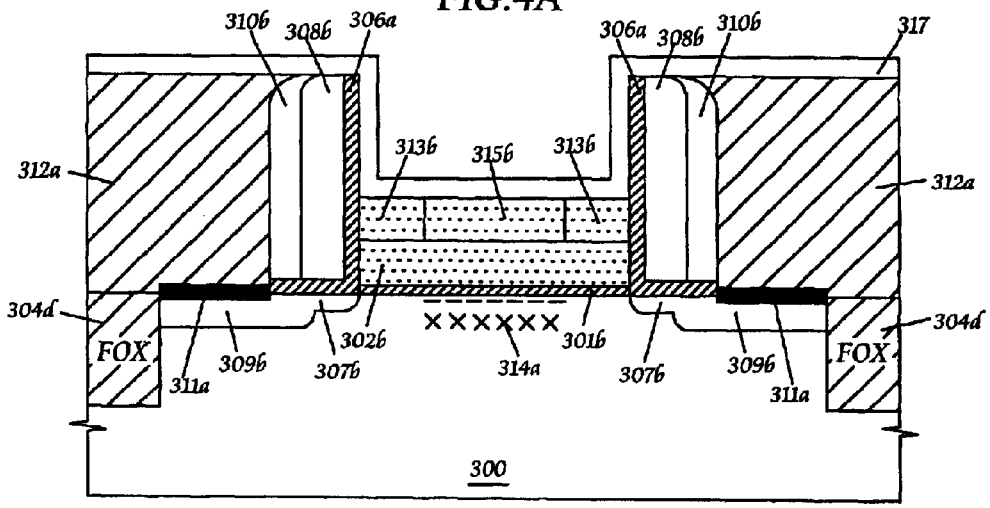

FIG. 4B shows that a barrier-metal layer 317 is formed over the whole structure including at least over the etched-back second conductive sidewall spacers 313b and the etched-back planarized third conductive layer 315b. The barrier-metal layer 317 is preferably made of titanium-nitrides (TiN) or tantalum-nitrides (TaN), as deposited by sputtering or LPCVD.

Figure 4C:
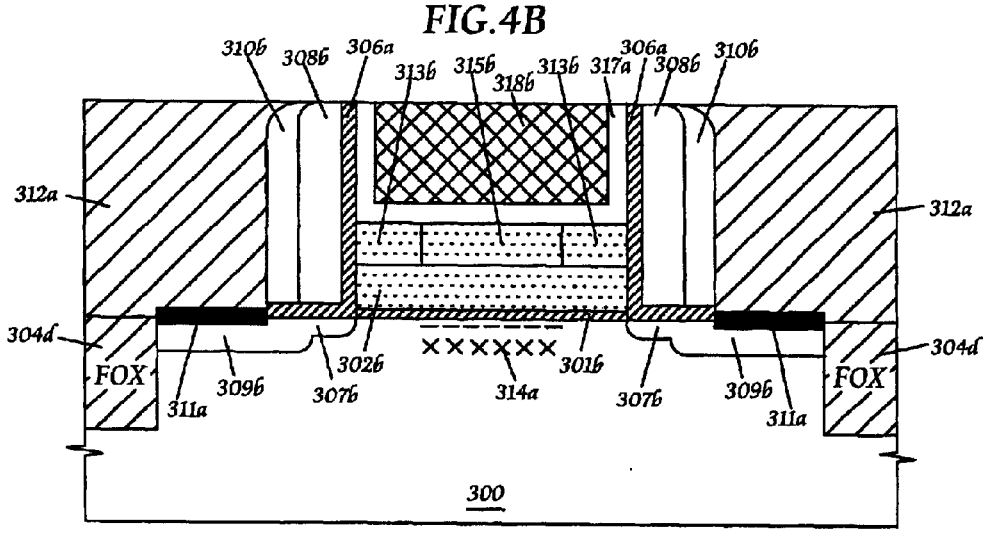

FIG. 4C shows that a thick metal film 318 is formed over the whole structure to fill up an etched-back gap in the gate region and a planarization process is then performed by using CMP or etching back to form a planarized metal layer 318b being lined with a barrier-metal layer 317a. The planarized metal layer 318b is preferably made of tungsten, aluminum, or copper, as deposited by sputtering or LPCVD. It is clearly seen that a highly conductive-gate structure is obtained by the present invention.

Accordingly, the advantages and features of the nanometer-gate MOSFET device of the present invention can be summarized as below:

(a) The nanometer-gate MOSFET device of the present invention offers a shallow-trench-isolation (STI) structure to eliminate the tunneling leakage current between the channel and the conductive-gate layer through the trench corners in the channel-width direction.

(b) The nanometer-gate MOSFET device of the present invention offers a buffer-oxide layer for the lateral extension of the lightly-doped source/drain diffusion regions to eliminate or alleviate the tunneling leakage current and the overlapping capacitances between the lightly-doped source/drain diffusion regions and the conductive-gate layer through the overlapping area.

(c) The nanometer-gate MOSFET device of the present invention offers a first sidewall dielectric spacer for forming the heavily-doped source/drain diffusion regions and a second sidewall dielectric spacer for forming the self-aligned metal-disilicide layers over the heavily-doped source/drain diffusion regions of the flat junction depth to improve the contact integrity and the contact resistances of the heavily-doped source/drain diffusion regions.

(d) The nanometer-gate MOSFET device of the present invention offers a conductive-gate structure for forming a self-aligned implant region in a central portion of the channel to reduce the parasitic source/drain junction capacitances and to improve the hot-electron reliability through the reduced drain-edge electric field.

(e) The nanometer-gate MOSFET device of the present invention offers a highly conductive-gate structure to reduce the gate-interconnection resistance.

(f) The nanometer-gate MOSFET device of the present invention offers a high-performance MOSFET device without increasing the masking steps.

While the present invention has been particularly shown and described with reference to the present examples and embodiments as considered as illustrative and not restrictive. Moreover, the present invention is not to be limited to the details given herein, it will be understood by those skilled in the art that various changes in form and details may be made without departure from the true spirit and scope of the invention.

What is claimed is:

1. A method of forming a nanometer-gate MOSFET device, comprising the steps of:

providing a semiconductor substrate of a first conductivity type;

forming a shallow-trench-isolation (STI) structure on said semiconductor substrate having an active region isolated by an isolation region, wherein said active region has a first conductive layer being formed over a gate-dielectric layer and said isolation region is filled with a first raised field-oxide layer;

forming a second masking dielectric layer over said STI structure having a flat surface formed by said first raised filed-oxide layers and said first conductive layer;

patterning a gate region to form a gate structure using a masking photoresist step by removing said second masking dielectric layer, etching said first raised field-oxide layers to a depth equal to a thickness of said first conductive layer to form second raised field-oxide layers, removing said first conductive layer, and removing said gate-dielectric layer and simultaneously etching said second raised field-oxide layers to form third raised field-oxide layers;

forming a buffer-oxide layer over said gate structure, said third raised field-oxide layers, and exposed semiconductor surfaces;

forming lightly-doped source and drain diffusion regions of a second conductivity type by implanting doping impurities across said buffer-oxide layers into said semiconductor substrate in a self-aligned manner;

forming a first sidewall dielectric spacer over each sidewall of said buffer-oxide layers and on said buffer-oxide layers;

forming heavily-doped source and drain diffusion regions of said second conductivity type by implanting doping impurities across said buffer-oxide layers into said semiconductor substrate in a self-aligned manner;

forming a second sidewall dielectric spacer over each sidewall of said first sidewall dielectric spacers and on said buffer-oxide layers;

etching back said first and second sidewall dielectric spacers to a thickness of said buffer-oxide layers and removing simultaneously said buffer-oxide layers over said second masking dielectric layer in said gate region and over said third raised field-oxide layers and said heavily-doped source/drain diffusion regions outside of said gate region;

forming a metal-disilicide layer over each of said heavily-doped source/drain diffusion regions outside of said second sidewall dielectric spacers by using a well-known self-aligned silicidation process;

forming a planarized thick-oxide layer over each side portion of said gate region;

removing selectively said second masking dielectric layer in said gate region;

forming a pair of second conductive sidewall spacers over each inner sidewall of said buffer-oxide layers and on a portion of said first conductive layer and said first raised field-oxide layers in said gate region;

forming an implant region in said semiconductor substrate by implanting doping impurities across said first conductive layer and said gate-dielectric layer between the pair of second conductive sidewall spacers in a self-aligned manner; and forming a planarized third conductive layer over said first conductive layer and said first raised field-oxide layers between the pair of second conductive sidewall spacers to form a conductive-gate structure for said nanometer-gate MOSFET device.

2. The method of claim 1, wherein said first conductive layer comprises a doped polycrystalline-silicon or doped amorphous-silicon layer with a thickness between 100 Angstroms and 1500 Angstroms.

3. The method of claim 1, wherein said gate-dielectric layer comprises a thermal-oxide or nitrided thermal-oxide layer having a thickness between 15 Angstroms and 300 Angstroms.

4. The method of claim 1, wherein said buffer-oxide layer comprises a silicon-dioxide layer as deposited by high-temperature oxide (HTO) deposition or LPCVD with a thickness between 100 Angstroms and 1000 Angstroms.

5. The method of claim 1, wherein said second masking dielectric layer comprises a silicon-nitride layer with a thickness between 2000 Angstroms and 8000 Angstroms.

6. The method of claim 1, wherein said first and second sidewall dielectric spacers are preferably made of silicon-dioxides and are separately formed by first depositing a silicon-dioxide film and then etching back a thickness of said silicon-dioxide film.

7. The method of claim 1, wherein said metal-disilicide layer comprises a refractory metal-disilicide layer such as titanium-disilicide ($TiSi_2$), cobalt-disilicide ($CoSi_2$), tantalum-disilicide ($TaSi_2$), nickle-disilicide ($NiSi_2$), molybdenum-disilicide ($MoSi_2$), platinum-disilicide ($PtSi_2$), tungsten-disilicide ($WiSi_2$), etc.

8. The method of claim 1, wherein the pair of second conductive sidewall spacers are preferably made of doped polycrystalline-silicon or tungsten-disilicides ($WSi_2$) and their spacer width is preferably between 200 Angstroms and 1000 Angstroms.

9. The method of claim 1, wherein said planarized third conductive layer is preferably made of doped polycrystalline-silicon or tungsten-disilicides.

10. The method of claim 1, wherein said implant region comprises a shallow implant region of said first or said second conductivity type for threshold-voltage adjustment and a deep implant region of said first conductivity type for forming a punch-through stop.

11. The method of claim 1, wherein the pair of second conductive sidewall spacers and said planarized third conductive layer being made of doped polycrystalline-silicon are further implanted with a high dose of doping impurities and are silicided with a refractory metal-disilicide layer by using a well-known self-aligned silicidation process.

12. The method of claim 1, wherein the pair of second conductive sidewall spacers are preferably made of tungsten-disilicides, and said planarized third conductive layer being made of doped polycrystalline-silicon is further implanted with a high dose of doping impurities and is silicided with a refractory metal-disilicide layer by using a well-known self-aligned silicidation process.

13. A method of forming a nanometer-gate MOSFET device, comprising the steps of:

providing a semiconductor substrate of a first conductivity type;

forming a shallow-trench-isolation (STI) structure on said semiconductor substrate having an active region isolated by an isolation region, wherein said active region has a first conductive layer being formed over a gate-dielectric layer and said isolation region is filled with a first raised field-oxide layer;

forming a second masking dielectric layer over said STI structure having a flat surface formed by said first raised field-oxide layers and said first conductive layer;

patterning a gate region to form a gate structure using a masking photoresist step by removing said second masking dielectric layer, etching said first raised field-oxide layers to a depth equal to a thickness of said first conductive layer to form second raised field-oxide layers, removing said first conductive layer, and removing said gate-dielectric layer and simultaneously etching said second raised field-oxide layers to form third raised field-oxide layers;

forming a buffer-oxide layer over said gate structure, said third raised field-oxide layers, and exposed semiconductor surfaces;

forming lightly-doped source and drain diffusion regions of a second conductivity type by implanting doping impurities across said buffer-oxide layers into said semiconductor substrate in a self-aligned manner;

forming a first sidewall dielectric spacer over each sidewall of said buffer-oxide layers and on said buffer-oxide layers;

forming heavily-doped source and drain diffusion regions of said second conductivity type by implanting doping impurities across said buffer-oxide layers into said semiconductor substrate in a self-aligned manner;

forming a second sidewall dielectric spacer over each sidewall of said first sidewall dielectric spacers and on said buffer-oxide layers;

etching back said first and second sidewall dielectric spacers to a thickness of said buffer-oxide layers and removing simultaneously said buffer-oxide layers over said second masking dielectric layer in said gate region and over said third raised field-oxide layers and said heavily-doped source/drain diffusion regions outside of said gate region;

forming a metal-disilicide layer over each of said heavily-doped source/drain diffusion regions outside of said second sidewall dielectric spacers by using a well-known self-aligned silicidation process;

forming a planarized thick-oxide layer over each side portion of said gate region;

removing selectively said second masking dielectric layer in said gate region;

forming a pair of second conductive sidewall spacers over each inner sidewall of said buffer-oxide layers and on a portion of said first conductive layer and said first raised field-oxide layers in said gate region;

forming an implant region in said semiconductor substrate by implanting doping impurities across said first conductive layer and said gate-dielectric layer between the pair of second conductive sidewall spacers in a self-aligned manner;

forming a barrier-metal layer over an exposed surface including at least the pair of second conductive sidewall spacers, said first conductive layer, and said first raised field-oxide layer in said gate region;

forming a thick metal film over said barrier-metal layer to fill up a gap formed between the pair of second conductive sidewall spacers; and planarizing said thick metal film and simultaneously removing said barrier-metal layers outside of said gate region to form a planarized metal layer being lined with said barrier-metal layer.

14. The method of claim 13, wherein said implant region comprises a shallow implant region of said first or said second conductivity type for threshold-voltage adjustment and a deep implant region of said first conductivity type for forming a punch-through stop.

15. The method of claim 13, wherein said barrier-metal layer comprises a titanium-nitride (TiN) or tantalum-nitride (TaN) layer.

16. The method of claim 13, wherein said planarized metal layer comprises a tungsten, aluminum, or copper layer.

17. A method of forming a nanometer-gate MOSFET device, comprising the steps of:

providing a semiconductor substrate of a first conductivity type;

forming a shallow-trench-isolation (STI) structure on said semiconductor substrate having an active region isolated by an isolation region, wherein said active region has a first conductive layer being formed over a gate-dielectric layer and said isolation region is filled with a first raised field-oxide layer;

forming a second masking dielectric layer over said STI structure having a flat surface formed by said first raised filled-oxide layers and said first conductive layer;

patterning a gate region to form a gate structure using a masking photoresist step by sequentially removing said second masking dielectric layer, etching said first raised field-oxide layers to a depth equal to a thickness of said first conductive layer to form second raised field-oxide layers, removing said first conductive layer, and removing said gate-dielectric layer and simultaneously etching said second raised field-oxide layers to form third raised field-oxide layers;

forming a buffer-oxide layer over said gate structure, said third raised field-oxide layers, and exposed semiconductor surfaces;

forming lightly-doped source and drain diffusion regions of a second conductivity type by implanting doping impurities across said buffer-oxide layers into said semiconductor substrate in a self-aligned manner;

forming a first sidewall dielectric spacer over each sidewall of said buffer-oxide layers and on said buffer-oxide layers;

forming heavily-doped source and drain diffusion regions of said second conductivity type by implanting doping impurities across said buffer-oxide layers into said semiconductor substrate in a self-aligned manner;

forming a second sidewall dielectric spacer over each sidewall of said first sidewall dielectric spacers and on said buffer-oxide layers;

etching back said first and second sidewall dielectric spacers to a thickness of said buffer-oxide layers and removing simultaneously said buffer-oxide layers over said second masking dielectric layer in said gate region and over said third raised field-oxide layers and said heavily-doped source/drain diffusion regions outside of said gate region;

forming a metal-disilicide layer over each of said heavily-doped source/drain diffusion regions outside of said second sidewall dielectric spacers by using a well-known self-aligned silicidation process;

forming a planarized thick-oxide layer over each side portion of said gate region;

removing selectively said second masking dielectric layer in said gate region;

forming a pair of second conductive sidewall spacers over each inner sidewall of said buffer-oxide layers and on a portion of said first conductive layer and said first raised field-oxide layers in said gate region;

forming an implant region in said semiconductor substrate by implanting doping impurities across said first conductive layer and said gate-dielectric layer between the pair of second conductive sidewall spacers in a self-aligned manner, wherein said implant region comprises a shallow implant region of said first or said second conductivity type for threshold-voltage adjustment and a deep implant region of said first conductivity type for forming a punch-through stop;

forming a planarized third conductive layer over said first conductive layer and said first raised field-oxide layers between the pair of second conductive sidewall spacers;

etching back simultaneously the pair of second conductive sidewall spacers and said planarized third conductive layer to form a conductive-gate layer over said first conductive layer;

forming a barrier-metal layer over an exposed surface including at least said conductive-gate layer and each inner sidewall of said buffer-oxide layers;

forming a thick metal film over said barrier-metal layer to fill up a gap formed by said conductive-gate layer and said buffer-oxide layers; and planarizing said thick metal film and simultaneously removing said barrier-metal layers outside of said gate region to form a planarized metal layer being lined with said barrier-metal layer.

18. The method of claim 17, wherein said conductive-gate layer comprises a doped polycrystalline-silicon layer or a tungsten-disilicide ($WSi_2$) layer.

19. The method of claim 17, wherein said barrier-metal layer comprises a titanium-nitride (TiN) or tantalum-nitride (TaN) layer.

20. The method of claim 17, wherein said planarized metal layer comprises a tungsten, aluminum, or copper layer.

* * * * *